(12) United States Patent
Nakamura et al.

(10) Patent No.: US 7,242,130 B2
(45) Date of Patent: Jul. 10, 2007

(54) PIEZOELECTRIC DEVICE, ANTENNA DUPLEXER, AND METHOD OF MANUFACTURING PIEZOELECTRIC RESONATORS USED THEREFOR

(75) Inventors: Hiroyuki Nakamura, Katano (JP); Keiji Onishi, Settsu (JP); Hiroshi Nakatsuka, Katano (JP); Hiroshi Yamaguchi, Katano (JP); Takehiko Yamakawa, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 183 days.

(21) Appl. No.: 10/979,276

(22) Filed: Nov. 3, 2004

(65) Prior Publication Data
US 2005/0099092 A1   May 12, 2005

(30) Foreign Application Priority Data
Nov. 7, 2003 (JP) .............................. 2003-378258

(51) Int. Cl.
*H01L 41/08* (2006.01)
*H03H 9/17* (2006.01)
*H03H 9/54* (2006.01)

(52) U.S. Cl. .................. 310/320; 310/324; 310/363; 310/364; 310/365; 310/366

(58) Field of Classification Search ............... 310/320, 310/324, 363–366
See application file for complete search history.

(56) References Cited

U.S. PATENT DOCUMENTS
6,349,454 B1   2/2002  Manfra et al.
2005/0168102 A1*  8/2005  Matsumoto et al. ........ 310/312

FOREIGN PATENT DOCUMENTS
| JP | 60-68710 | 4/1985 |
| JP | 2002-198758 | 7/2002 |
| JP | 2002-268645 | 9/2002 |
| JP | 2002-359539 | 12/2002 |
| JP | 2003-32060 | 1/2003 |

OTHER PUBLICATIONS

Hiroshi Nakatsuka et al., U.S. Appl. No. 10/979,420, filed Nov. 3, 2004.
Hiroshi Yamaguchi et al., U.S. Appl. No. 10/979,277, filed Nov. 3, 2004.

\* cited by examiner

*Primary Examiner*—J. San Martin
(74) *Attorney, Agent, or Firm*—Wenderoth, Lind & Ponack, L.L.P.

(57) ABSTRACT

A piezoelectric device of the present invention includes first and second piezoelectric resonators. The first piezoelectric resonator has a structure in which a cavity, a lower electrode, a piezoelectric layer, and an upper electrode are formed on a substrate. The second piezoelectric resonator has a structure in which a cavity, a lower electrode, a piezoelectric layer, and an upper electrode are formed on the substrate. A feature of the above-structure piezoelectric device is that the piezoelectric layers, have the same film thickness, and the depth of the cavity of the first piezoelectric resonator is different from the depth of the cavity of the second piezoelectric resonator.

20 Claims, 12 Drawing Sheets

PIEZOELECTRIC DEVICE, ANTENNA DUPLEXER, AND METHOD OF MANUFACTURING PIEZOELECTRIC RESONATORS USED THEREFOR

BACKGROUND OF THE INVENTION

1. Field of the Invention

The present invention relates to a piezoelectric device including a plurality of piezoelectric resonators formed on the same substrate, an antenna duplexer, and a method of manufacturing the plurality of piezoelectric resonators.

2. Description of the Background Art

In recent years, with the expansion of mobile communications, devices for use in communication appliances have been expected to be small in size with high capability. One of the devices for mobile communication appliances is a filter, which is exemplarily structured by a piezoelectric resonator. This piezoelectric resonator is structured such that an upper electrode, a lower electrode, and a piezoelectric layer positioned between these electrodes are formed on a substrate. Also, the substrate is provided with a cavity or an acoustic mirror for ensuring vibrations of the piezoelectric resonator. In a ladder filter in which a plurality of such piezoelectric resonators are connected to form a ladder type, low-loss and high-attenuation characteristics are expected. Such a ladder filter is also applied to an antenna duplexer for mobile communication appliances.

To configure such a ladder filter and an antenna duplexer by using a plurality of piezoelectric resonators, a resonant frequency of each of the piezoelectric resonators has to be adjusted. For adjusting the resonant frequency of the piezoelectric resonator, the piezoelectric resonators are made different from each other in thickness of the piezoelectric layer, film thickness of the electrode, mass load, or the like. Examples of a technology of adjusting the resonant frequency of each piezoelectric element are disclosed in Japanese Patent Laid-Open Publication No. 2002-268645 (hereinafter referred to as a first conventional technical document) and Japanese Patent Laid-Open Publication No. 2002-359539 (hereinafter refereed to as a second conventional technical document).

The first conventional technical document discloses a technology for forming a plurality of piezoelectric resonators having different resonant frequencies by varying thicknesses of piezoelectric layers and film thicknesses of upper electrodes. FIG. 8 is a section view of a conventional piezoelectric device 800 with such piezoelectric resonators formed in this manner.

In FIG. 8, the piezoelectric device 800 includes piezoelectric resonators 810 and 820. The piezoelectric resonator 810 has a structure in which an acoustic mirror 811, a lower electrode 812, a piezoelectric layer 813, and an upper electrode 814 are sequentially formed on a substrate 801. The piezoelectric resonator 820 has a structure in which an acoustic mirror 821, a lower electrode 822, a piezoelectric layer 823, and an upper electrode 824 are sequentially formed on the substrate 801. The piezoelectric layer 813 is different from the piezoelectric layer 823 in film thickness. Also, the upper electrode 814 is different from the upper electrode 824 in film thickness. With this, the resonant frequencies of the piezoelectric resonators 810 and 820 are adjusted.

The second conventional technical document discloses a technology for forming a plurality of piezoelectric resonators having different resonant frequencies by varying mass loads on electrodes. FIG. 9 is a section view of a conventional piezoelectric device 900 with such piezoelectric resonators formed in this manner.

In FIG. 9, the piezoelectric device 900 includes piezoelectric resonators 910 and 920. The piezoelectric resonator 910 has a structure in which a cavity 911, a lower electrode 912, a piezoelectric layer 913, an upper electrode 914, and an oxidized conductive material portion 915 are sequentially formed on a substrate 901. The piezoelectric resonator 920 has a structure in which a cavity 921, a lower electrode 922, a piezoelectric layer 923, and an upper electrode 924 are sequentially formed on the substrate 901. The cavities 911 and 921 are provided to ensure vibrations of the piezoelectric resonators 910 and 920. As such, the oxidized conductive material portion 915 is formed so as to vary the mass load on the piezoelectric layer 913 from the mass load on the piezoelectric layer 923, thereby adjusting the resonant frequencies.

However, in the first conventional technical document, the film thicknesses of the piezoelectric layers have to be made different from each other in order to achieve desired resonant frequencies. This disadvantageously makes the manufacturing process complex.

Moreover, in the second conventional technical document, a material is added to a vibrating portion for increasing a mass load. However, this disadvantageously decreases an effective coupling coefficient of the piezoelectric resonators.

SUMMARY OF THE INVENTION

Therefore, an object of the present invention is to provide a piezoelectric device and an antenna duplexer by readily forming a plurality of piezoelectric resonators having different resonant frequencies on the same substrate without decreasing an effective coupling coefficient. Another object of the present invention is to provide a method of easily manufacturing such piezoelectric resonators.

The present invention is directed to a piezoelectric device. To achieve the objects mentioned above, the piezoelectric device according to the present invention includes plurality of piezoelectric resonators each including a substrate, a cavity formed on a substrate, a lower electrode layer formed on the substrate so as to cover the cavity, a piezoelectric layer formed on the lower electrode, and an upper electrode formed on the piezoelectric layer. Also, at least one of the plurality of the piezoelectric resonators is different in cavity depth from other piezoelectric resonators.

At least one of the cavities is formed inside of the substrate or is formed as penetrating a thin film laminated on the substrate and being inside of the substrate. Also, the piezoelectric resonators may be connected to form a ladder type or a lattice type. In this case, when the piezoelectric resonators at least include a first piezoelectric resonator which operates as a serial resonator and a second piezoelectric resonator which operates as a parallel resonator, a depth of a cavity of the first piezoelectric resonator is preferably different from a depth of a cavity of the second piezoelectric resonator. Also, when at least two of the piezoelectric resonators operate as serial resonators or parallel resonators, at least one of the serial resonators or at least one of the parallel resonators is preferably different in cavity depth from other piezoelectric resonators. Furthermore, when the piezoelectric resonators include at least first and second piezoelectric resonators both of which operate as serial resonators or parallel resonators, a depth of a cavity of the first piezoelectric resonator is preferably different from a depth of a cavity of the second piezoelectric resonator.

Here, an antenna duplexer can be achieved by using a transmission filter formed by the piezoelectric device of the present invention, a reception filter formed by the piezoelectric device of the present invention, and a phase-shift circuit connecting the transmission filter and the reception filter to each other.

The present invention is also directed to a method of manufacturing a plurality of piezoelectric resonators having different resonant frequencies on a same substrate. To achieve the objects mentioned above, in the manufacturing method according to the present invention, at least two cavities having different depths are formed on the substrate in accordance with a resonance frequency of each of the plurality of piezoelectric resonators, a lower electrode is formed so as to cover each of the cavities, a piezoelectric layer is formed on the lower electrode, and then an upper electrode is formed on the piezoelectric layer.

Preferably, the depths of the cavities are controlled by an amount of etching of the substrate and/or an amount of etching of a thin film laminated on the substrate. Alternatively, the depths of the cavities are controlled by laminating an adjusting layer on a bottom of a cavity formed by etching.

According to the present invention, by using a phenomenon in which the resonant frequency and the anti-resonant frequency of piezoelectric resonators are varied with the cavity depth, a plurality of piezoelectric resonators having different resonant frequencies can be formed on the same substrate. Therefore, by using such piezoelectric resonators, a piezoelectric device and an antenna duplexer having an excellent characteristic can be easily achieved.

These and other objects, features, aspects and advantages of the present invention will become more apparent from the following detailed description of the present invention when taken in conjunction with the accompanying drawings.

DESCRIPTION OF THE INVENTION

With reference to the drawings, embodiments of the present invention are described below.

First Embodiment

Figure 1:
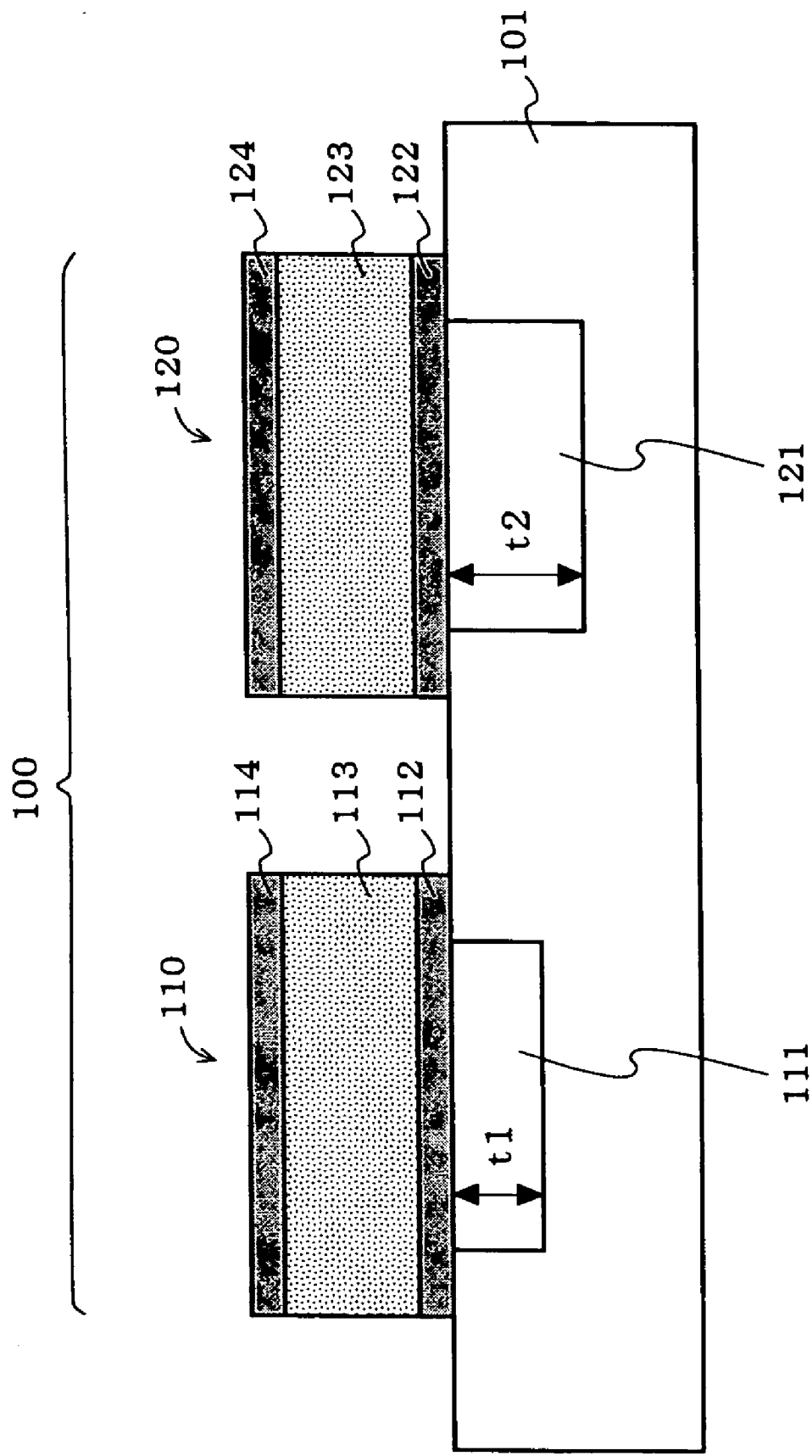
FIG. 1 is a section view of a piezoelectric device according to a first embodiment of the present invention.

FIG. 1 is a section view of a piezoelectric device 100 according to a first embodiment of the present invention. As shown in FIG. 1, the piezoelectric device 100 includes two piezoelectric resonators 110 and 120 so as to function as a piezoelectric filter. The piezoelectric resonator 110 has a structure in which a cavity 111, a lower electrode 112, a piezoelectric layer 113, and an upper electrode 114 are sequentially formed on a substrate 101. The piezoelectric resonator 120 has a structure in which a cavity 121, a lower electrode 122, a piezoelectric layer 123, and an upper electrode 124 are sequentially formed on the substrate 101. The cavities 111 and 121 are provided to ensure vibrations of the piezoelectric resonators 110 and 120. The cavities 111 and 121 are formed by etching the substrate 101. Note that, in the present embodiment, the description is exemplary to a piezoelectric device including two piezoelectric resonators. However, an arbitrary number of piezoelectric resonators can be used in accordance with the use purpose (for functioning as a resonator, a filter, or the like).

In the piezoelectric device 100 according to the first embodiment, in order to form a plurality of piezoelectric resonators having different resonant frequencies on the same substrate, a scheme is used in which the film thickness of the piezoelectric layer 113 is made equal to that of the piezoelectric layer 123 and a depth t1 of the cavity 111 and a depth t2 of the cavity 121 are made different from each other. This scheme uses a phenomenon newly found by the inventors in which "the resonant frequency and the anti-resonant frequency of the piezoelectric resonator are varied with the cavity depth."

Note that these two piezoelectric resonators 110 and 120 having different cavity depths can be easily made by controlling the amount of etching of the substrate 101.

Figure 2A:
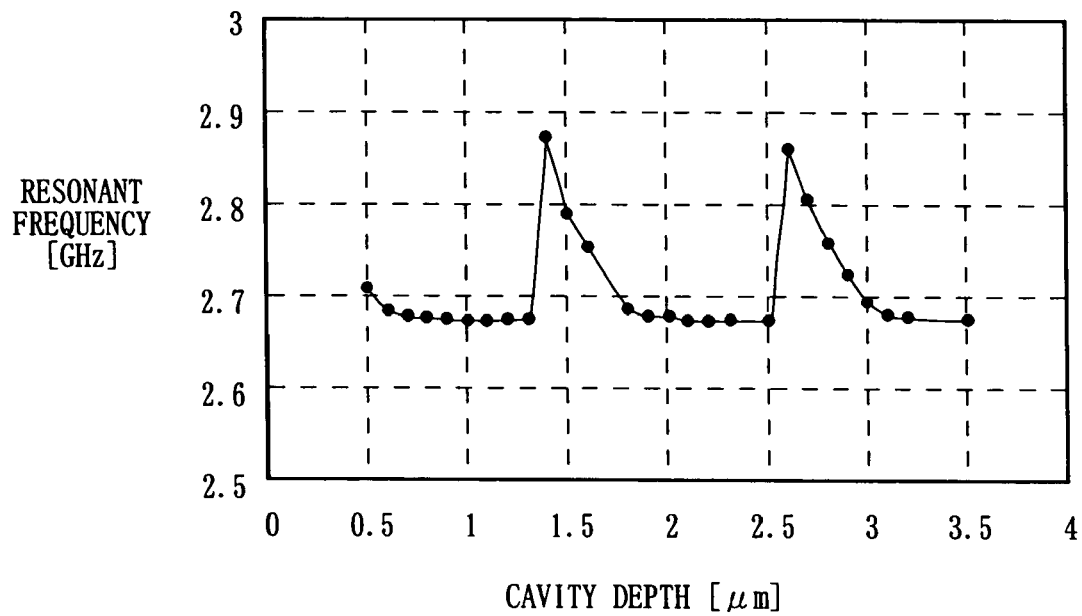
FIG. 2A is a diagram showing a relation between a cavity depth and a resonant frequency in the piezoelectric device according to the present invention.
Figure 2B:
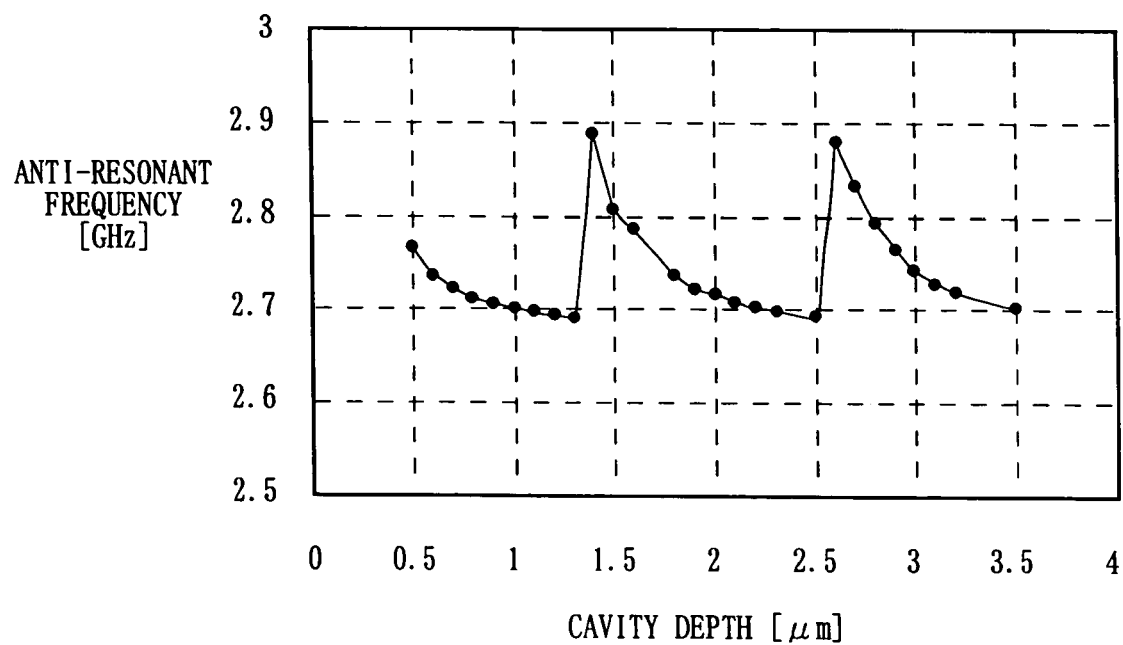
FIG. 2B is a diagram showing a relation between a cavity depth and an anti-resonant frequency in the piezoelectric device according to the present invention.

Hereinafter, description is made to the phenomenon in which the resonant frequency and the anti-resonant frequency of the piezoelectric resonator are varied with the cavity depth. FIG. 2A is a diagram showing a relation between a resonant frequency of a piezoelectric resonator and a cavity depth. FIG. 2B is a diagram showing a relation between an anti-resonant frequency of a piezoelectric resonator and a cavity depth. FIGS. 2A and 2B depict characteristics of a piezoelectric resonator in which a piezoelectric layer made of aluminum nitride (AlN) having a thickness of 0.5 μm and an upper electrode and lower electrode both made of molybdenum (Mo) having a thickness of 0.2 μm are formed on a silicon (Si) substrate.

As shown in FIGS. 2A and 2B, the resonant frequency and the anti-resonant frequency of the piezoelectric resonator are varied with the cavity depth. For example, when it is assumed in FIG. 1 that the depth t1 of the cavity 111 of the piezoelectric resonator 110 is 1.5 μm and the depth t2 of the cavity 121 of the piezoelectric resonator 120 is 2.0 μm, the resonant frequency of the piezoelectric resonator 110 is 2.79 GHz, while the resonant frequency of the piezoelectric resonator 120 is 2.68 GHz. Therefore, the resonant frequencies of these two piezoelectric resonators can be varied by 0.11 GHz.

As shown in FIGS. 2A and 2B, the resonant frequency and the anti-resonant frequency of the piezoelectric resonator are periodically varied with the cavity depth. Out of that period, however, the resonant frequency may have the same value even with different cavity depths. The same goes for the anti-resonant frequency. Therefore, it is preferable that an optimum cavity depth be selected within the period for achieving each desired resonant frequency and anti-resonant frequency.

Figure 3A:
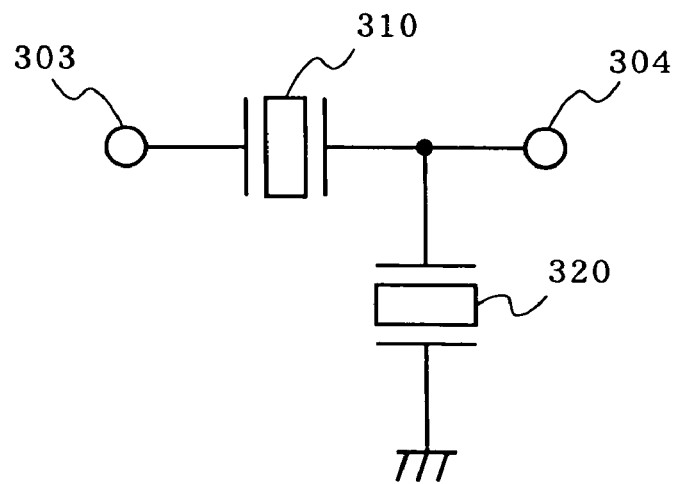
FIGS. 3A-3C are illustrations showing detailed examples of a structure of the piezoelectric device according to the present invention.
Figure 3B:
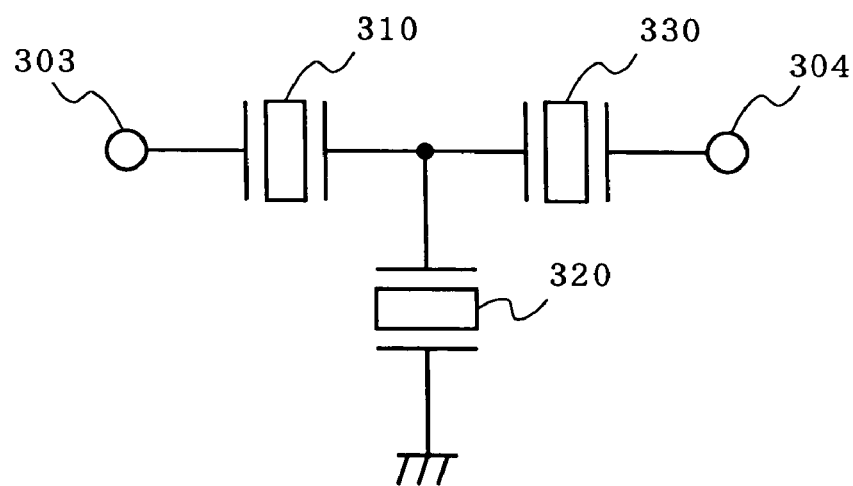
Figure 3C:
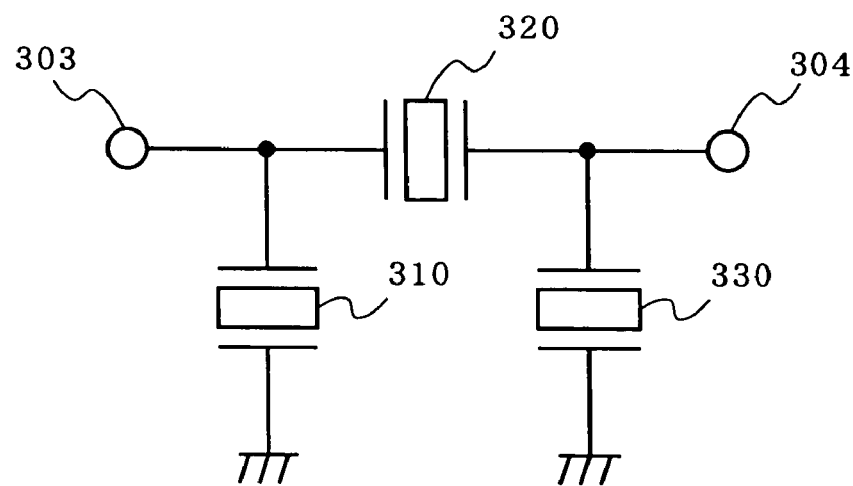

With reference to FIGS. 3A through 3C, specific examples of the structure of the piezoelectric device 100 according to the first embodiment using a plurality of piezoelectric resonators having different resonant frequencies and different anti-resonant frequencies achieved by varying cavity depths are described.

FIG. 3A shows an example of a structure of an L-type ladder filter. In FIG. 3A, a piezoelectric resonator 310 is connected in series between an input terminal 303 and an output terminal 304 for operating as a serial resonator. A piezoelectric resonator 320 is connected between a path connecting the input terminal 303 and the output terminal 304 together and a ground plane for operating as a parallel resonator. With such connections, an L-type ladder filter can be formed. Here, the resonant frequency of the piezoelectric resonator 310 is set higher than the resonant frequency of the piezoelectric resonator 320, thereby achieving an L-type ladder filter having a band-pass characteristic. Preferably, the resonant frequency of the piezoelectric resonator 310 is set substantially equal to or near the anti-resonant frequency of the piezoelectric resonator 320, thereby achieving an L-type ladder filter with better band-pass flatness.

FIG. 3B shows an example of a structure of a T-type ladder filter. In FIG. 3B, piezoelectric resonators 310 and 330 are connected in series between the input terminal 303 and the output terminal 304 for operating as serial resonators. The piezoelectric resonator 320 is connected between a path connecting the input terminal 303 and the output terminal 304 together and the ground plane for operating as a parallel resonator. With such connections, a T-type ladder filter can be formed. Here, the resonant frequencies of the piezoelectric resonators 310 and 330 are preferably set substantially equal to or near the anti-resonant frequency of the piezoelectric resonator 320 so as to achieve a desired band-pass characteristic. Also, with the resonant frequencies of the piezoelectric resonators 310 and 330 being optimally set, the band-pass flatness can be improved.

FIG. 3C shows an example of a structure of a Π-type ladder filter. In FIG. 3C, the piezoelectric resonator 320 is connected in series between the input terminal 303 and the output terminal 304 for operating as a serial resonator. The piezoelectric resonators 310 and 330 are connected between a path connecting the input terminal 303 and the output terminal 304 together and the ground plane for operating as parallel resonators. With such connections, a Π-type ladder filter can be formed. Here, the resonant frequency of the piezoelectric resonator 320 is preferably set substantially equal to or near the anti-resonant frequencies of the piezoelectric resonators 310 and 330 so as to achieve a desired band-pass characteristic. Also, with the resonant frequencies of the piezoelectric resonators 310 and 330 being optimally set, the band-pass flatness can be improved.

Figure 4A:
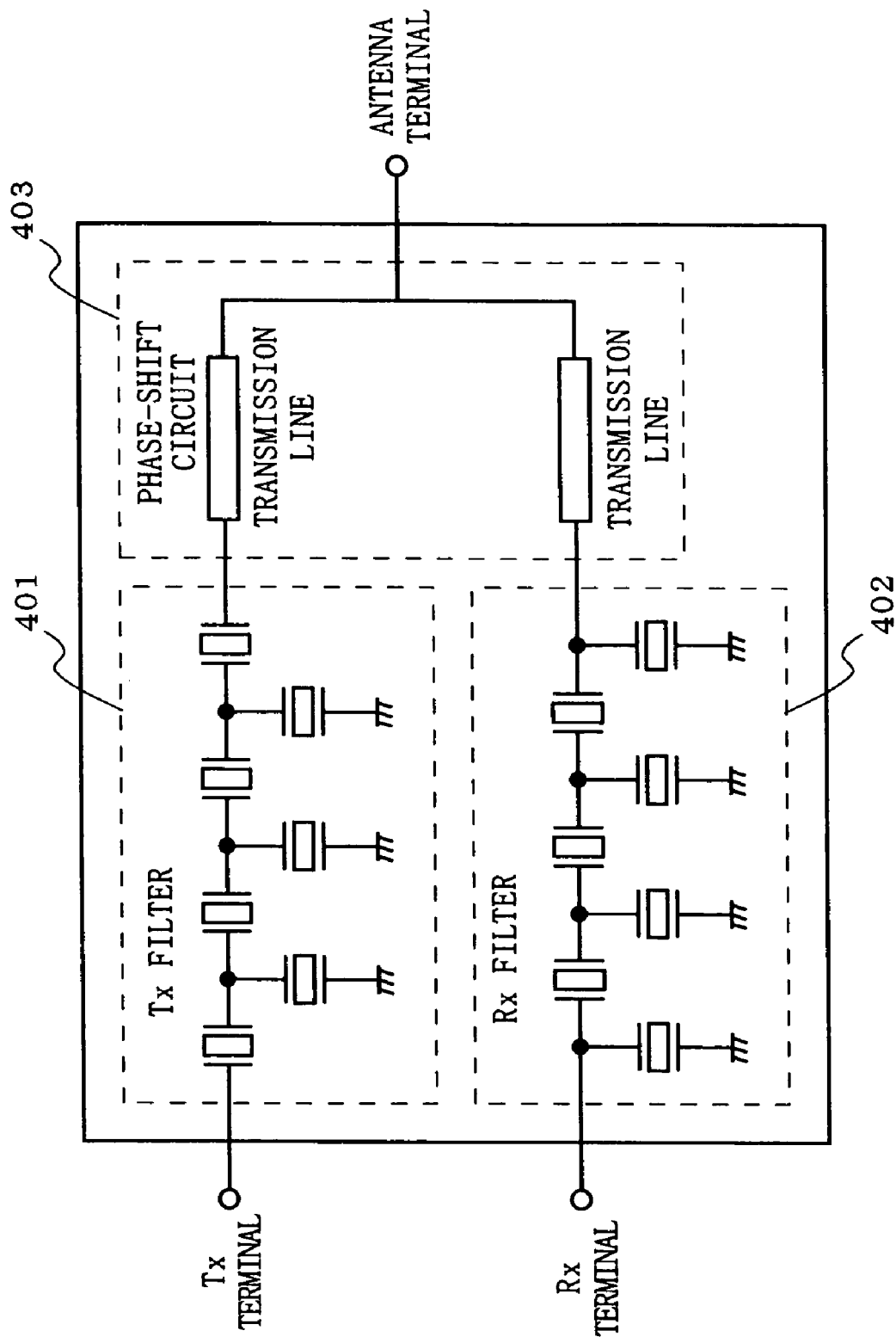
FIG. 4A is an illustration showing an example of a structure of an antenna duplexer using the piezoelectric device according to the present invention.
Figure 4B:
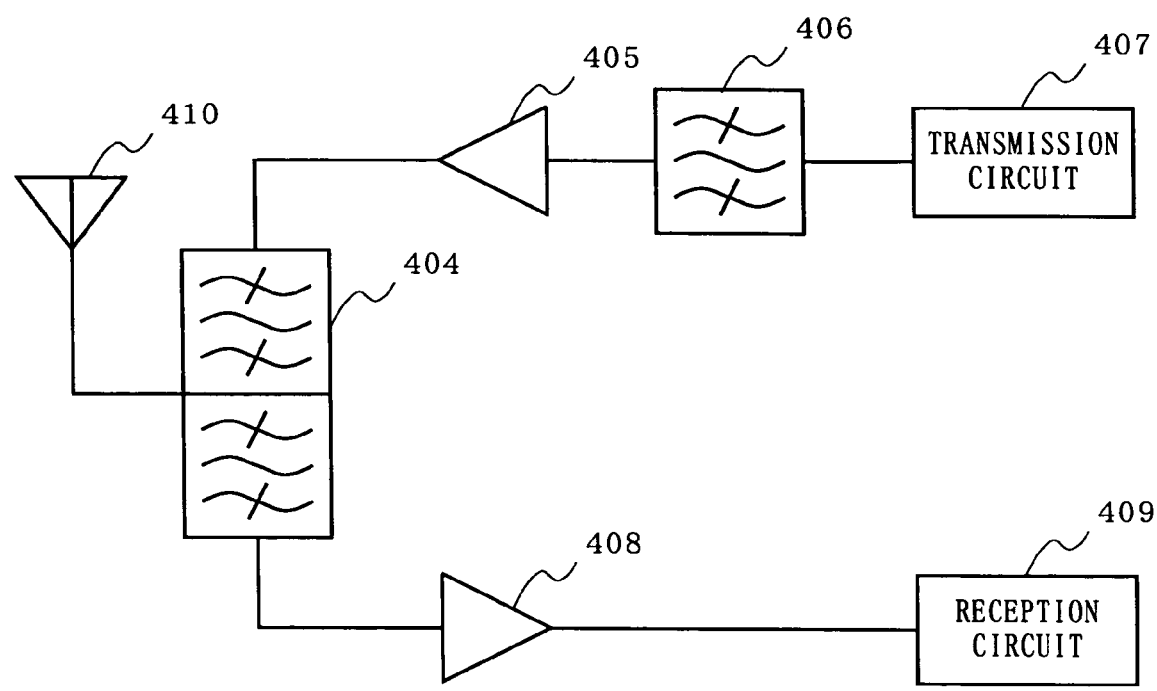
FIG. 4B is an illustration showing an example of a communication appliance using the antenna duplexer shown in FIG. 4A.

With reference to FIGS. 4A and 4B, examples of a structure of an antenna duplexer and a structure of a communication appliance using the piezoelectric device 100 according to the first embodiment are described.

FIG. 4A shows an example of a structure of the antenna duplexer. In FIG. 4A, the antenna duplexer includes a Tx filter (transmission filter) 401 and a Rx filter (reception filter) 402 to which the piezoelectric device according to the present invention is applied, and a phase-shift circuit 403 including two transmission lines. The Tx filter 401 lets a transmission-band signal to pass therethrough to attenuate a reception-band signal. The Rx filter 402 lets a reception-band signal to pass therethrough to attenuate a transmission-band signal. With this, an antenna duplexer with an excellent characteristic, such as low loss, can be achieved. Note that the number of filters, the number of stages of piezoelectric resonators forming each filter, and the like are not restricted to those exemplarily shown in FIG. 4A, and can be arbitrarily set.

FIG. 4B shows an example of a structure of the communication appliance. In FIG. 4B, the communication appliance includes an antenna duplexer 404 as shown in FIG. 4A, a transmission amplifier 405, a filter 406, a transmission circuit 407, a reception amplifier 408, a reception circuit 409, and an antenna 410. A transmission signal output from the transmission circuit 407 is input via the filter 406 and the transmission amplifier 405 to the antenna duplexer 404. The transmission signal input to the antenna duplexer 404 is transmitted via the antenna 410. On the other hand, a reception signal received at the antenna 410 is input via the antenna duplexer 404 and the reception amplifier 408 to the reception circuit 409. As such, by using the antenna duplexer 404 with an excellent characteristic, such as low loss, a small-sized, high-performance communication appliance can be achieved. Note that the piezoelectric device according to the present invention may be used as the filter 406. Also, the communication appliance is not restricted to that exemplarily shown in FIG. 4B, but can be arbitrarily designed.

As described in the first embodiment, by using the phenomenon in which the resonant frequency of the piezoelectric resonator is varied with the cavity depth, a plurality of piezoelectric resonators having different resonant frequencies can be formed on the same substrate. Thus, by using such piezoelectric resonators, a piezoelectric device and an antenna duplexer with an excellent characteristic can be easily realized.

As a specific structure of the piezoelectric device 100 according to the present embodiment, a one-stage ladder filter has been exemplarily described. However, the piezoelectric device 100 may be a multiple-stage ladder filter. Also, the piezoelectric resonators can be formed in a lattice type as well as a ladder type to achieve the similar effects. When two or more piezoelectric resonators are formed in a ladder type or a lattice type so as to operate as serial resonators, it is desirable that at least one serial resonator be different in cavity depth from the other piezoelectric resonators. For example, in FIG. 3B, the piezoelectric resonators 310 and 330 are made different from each other in cavity depth. Also, the piezoelectric device according to the present invention can be applied not only to the ladder filter but also to a filter formed only by serial resonators. Furthermore, when two or more piezoelectric resonators are formed so as to operate as parallel resonators, it is desirable that at least one parallel resonator be different in cavity depth from the other piezoelectric resonators. For example, in FIG. 3C, the piezoelectric resonators 310 and 330 are made different from each other in cavity depth. Also, the piezoelectric device according to the present invention can be applied not only to the ladder filter but also to a filter formed only by parallel resonators. Still further, a plurality of piezoelectric filters having a plurality of piezoelectric resonators may be formed on a single piezoelectric device. In this case, a plurality of filters having different frequencies can be formed on a single substrate as long as any one of the piezoelectric filter is different from the others in cavity depth, irrespective of the cavity depth of each piezoelectric resonator included in a piezoelectric filter.

Still further, the scheme according to the present invention for adjusting the resonant frequencies by varying the cavity depths can be used in combination with a conventional scheme, such as a scheme of varying the film thicknesses of the piezoelectric layers. With such combination, the range of adjustment of the resonant frequencies can be widened.

Still further, the piezoelectric layer forming the piezoelectric resonator according to the present invention may be a monocrystal or a piezoelectric ceramic to achieve similar effects as long as the piezoelectric layer requires a cavity. Also, a quantitative value of the cavity depth may vary depending on the substrate material or the piezoelectric material. However, the phenomenon in which the resonant frequency is periodically varied with the cavity depth occurs in any case. Therefore, the present invention can be applied to materials other than those described above.

In the second through fourth embodiments described below, structures of other piezoelectric devices achieving a function equivalent to that of the piezoelectric device 100 according to the first embodiment are described.

Second Embodiment

Figure 5A:
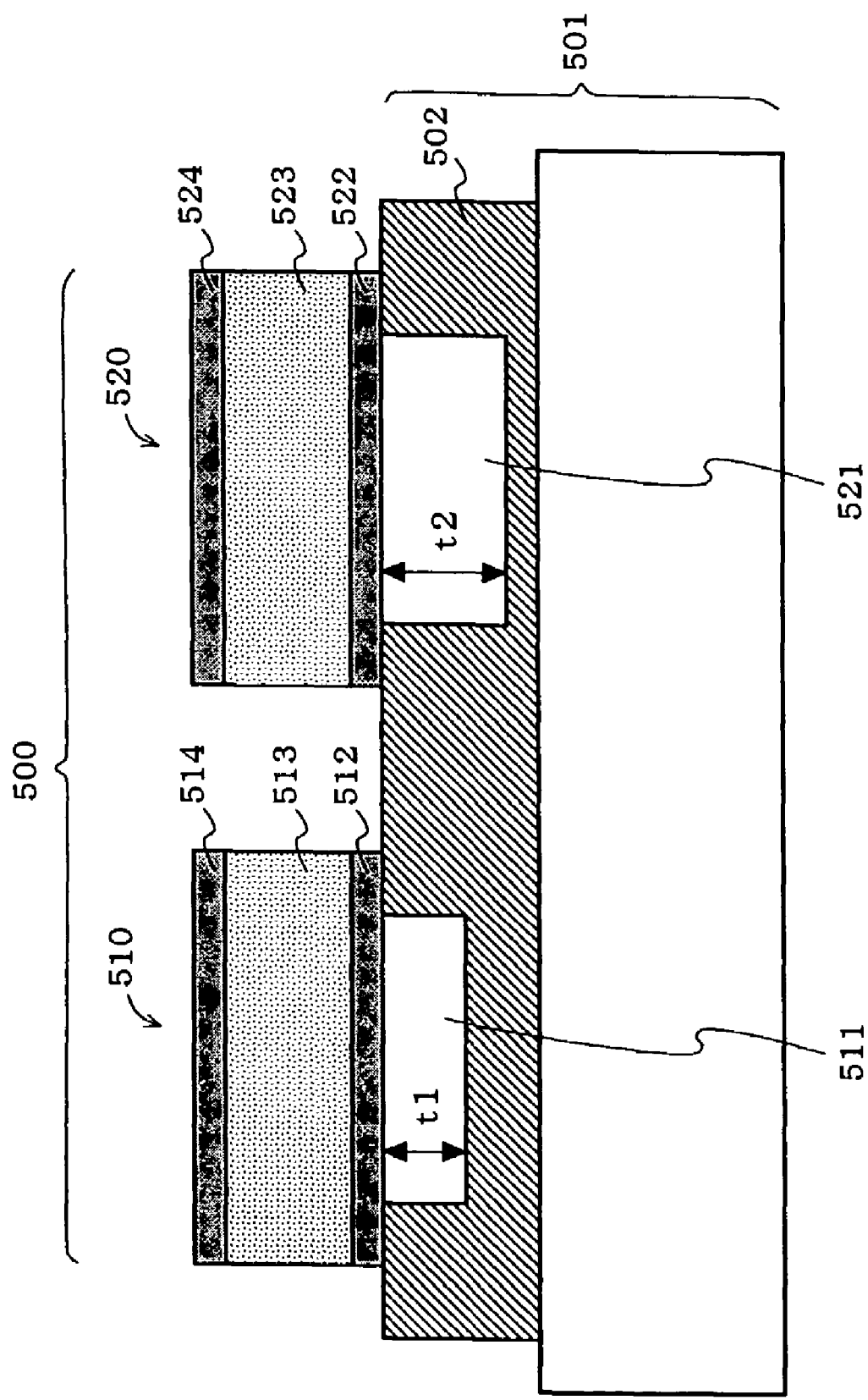
FIGS. 5A and 5B are section views of a piezoelectric device according to a second embodiment of the present invention.

FIG. 5A is a section view of a piezoelectric device 500 according to the second embodiment of the present invention. As shown in FIG. 5A, the piezoelectric device 500 includes two piezoelectric resonators 510 and 520 so as to function as a piezoelectric filter. The piezoelectric resonator 510 has a structure in which a cavity 511, a lower electrode 512, a piezoelectric layer 513, and an upper electrode 514 are sequentially formed on a substrate 501 having a thin film 502 laminated thereon. The piezoelectric resonator 520 has a structure in which a cavity 521, a lower electrode 522, a piezoelectric layer 523, and an upper electrode 524 are sequentially formed on the substrate 501 having the thin film 502 laminated thereon. The cavities 511 and 521 are provided to ensure vibrations of the piezoelectric resonators 510 and 520. The cavities 511 and 521 are formed by etching the thin film 502. The thin film 502 is made of a dielectric material, such as $SiO_2$ or $Si_3N_4$. Also, the thin film 502 may be made of AlN (any material suffices as long as the lower electrodes of the piezoelectric resonators formed on the thin film can be insulated from each other).

As with the first embodiment, in the piezoelectric device 500 according to the second embodiment, in order to form a plurality of piezoelectric resonators having different resonant frequencies on the same substrate, a scheme is used in which the film thickness of the piezoelectric layer 513 is made equal to that of the piezoelectric layer 523 and a depth t1 of the cavity 511 and a depth t2 of the cavity 521 are made different from each other. What is different about the piezoelectric device 500 according to the second embodiment from the piezoelectric device 100 according to the first embodiment is that the depths of the cavities 511 and 521 are varied by controlling the amount of etching of the thin film 502.

In the second embodiment, by using the phenomenon in which the resonant frequency of the piezoelectric resonator is varied with the cavity depth, a plurality of piezoelectric resonators having different resonant frequencies can be formed on the same substrate. Therefore, with the use of such piezoelectric resonators, a piezoelectric device (e.g., FIGS. 3A through 3C) and an antenna resonator (e.g., FIG. 4A) with an excellent characteristic can be easily achieved.

Figure 5B:
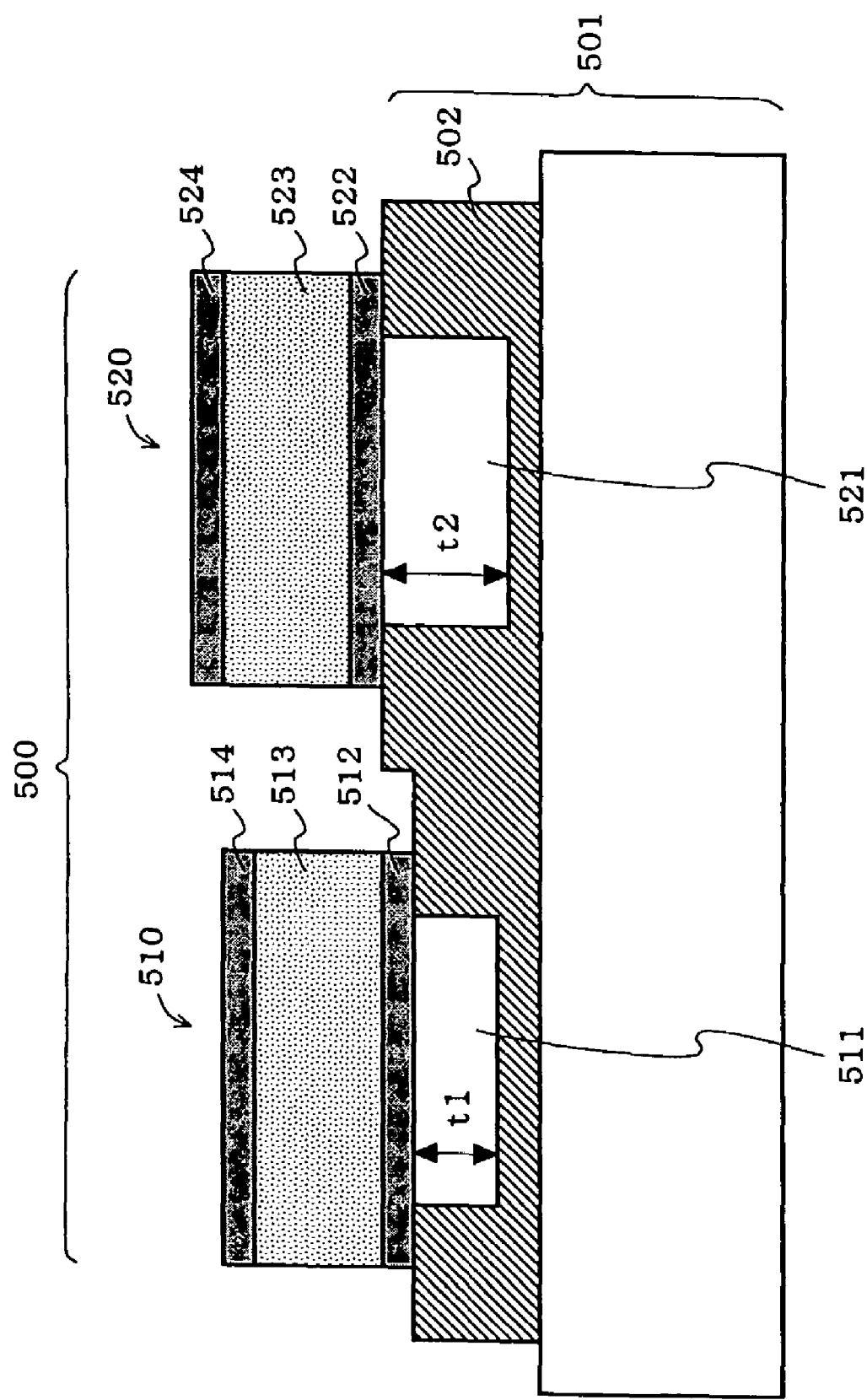

Note that, as shown in FIG. 5B, as long as the depth t1 of the cavity 511 and the depth t2 of the cavity 521 are different, the thickness of the thin film 502 may be varied between the piezoelectric resonator 510 and the piezoelectric resonator 520. Also, the material of the thin film 502 may be arbitrary as long as it sufficiently support the piezoelectric resonators and allows formation of the cavities. Furthermore, the thin film 502 may be of one layer or multiple layers. The cavity depths are preferably set based on a sound velocity of the thin film 502, for example.

Third Embodiment

Figure 6A:
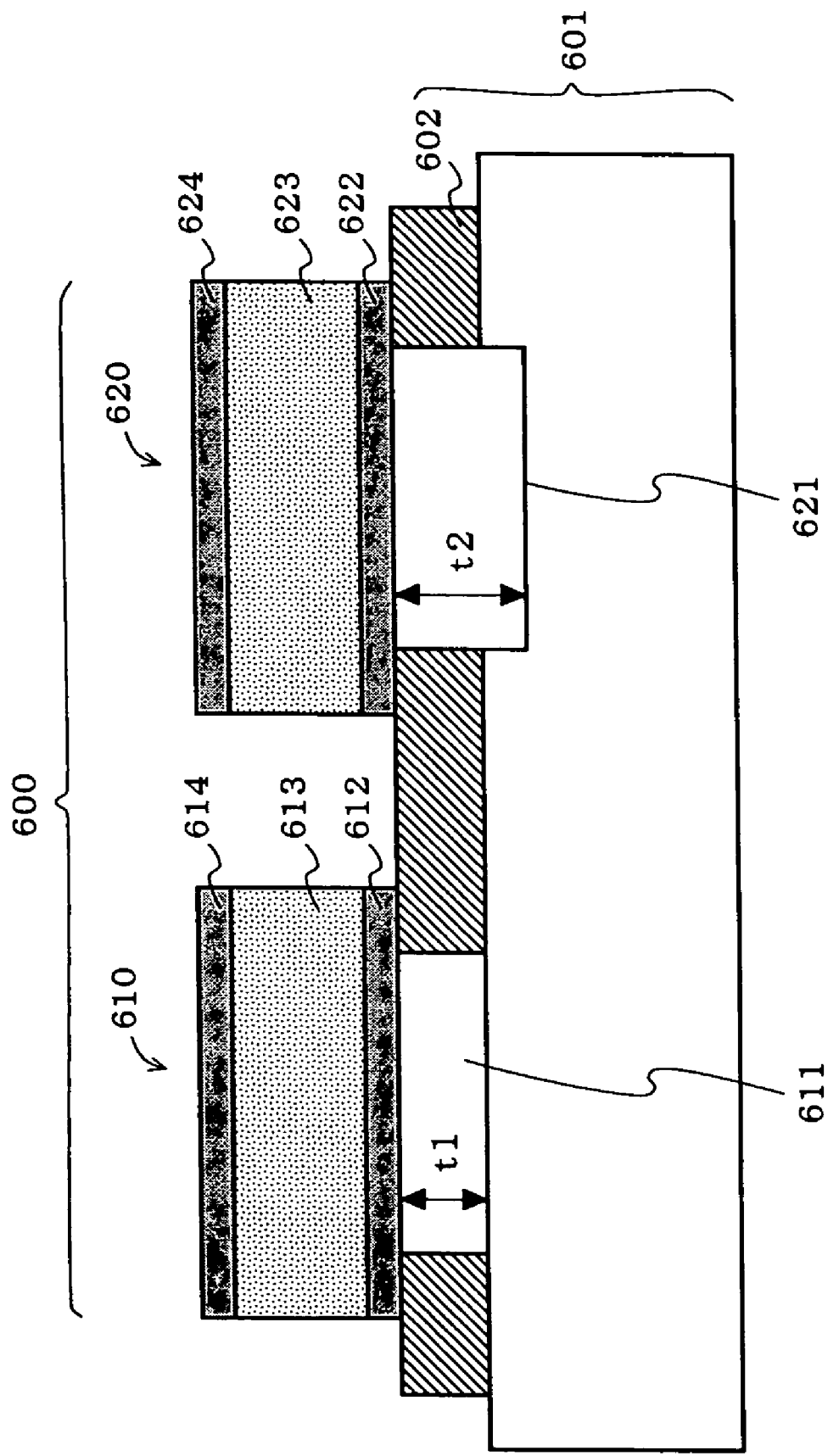
FIGS. 6A and 6B are section views of a piezoelectric device according to a third embodiment of the present invention.

FIG. 6A is a section view of a piezoelectric device 600 according to the third embodiment of the present invention. As shown in FIG. 6A, the piezoelectric device 600 includes two piezoelectric resonators 610 and 620 so as to function as a piezoelectric filter. The piezoelectric resonator 610 has a structure in which a cavity 611, a lower electrode 612, a piezoelectric layer 613, and an upper electrode 614 are sequentially formed on a substrate 601 having a thin film 602 laminated thereon. The piezoelectric resonator 620 has a structure in which a cavity 621, a lower electrode 622, a piezoelectric layer 623, and an upper electrode 624 are sequentially formed on the substrate 601 having the thin film 602 laminated thereon. The cavities 611 and 612 are provided to ensure vibrations of the piezoelectric resonators 610 and 620. These cavities 611 and 612 are formed by etching only the thin film 602 or both the thin film 602 and the substrate 601. The thin film 602 is made of a dielectric material, such as $SiO_2$ or $Si_3N_4$. Also, the thin film 602 may be made of AlN (any material suffices as long as the lower electrodes of the piezoelectric resonators formed on the thin film can be insulated from each other).

As with the first and second embodiments, in the piezoelectric device 600 according to the third embodiment, in order to form a plurality of piezoelectric resonators having different resonant frequencies on the same substrate, a scheme is used in which the film thickness of the piezoelectric layer 613 is made equal to that of the piezoelectric layer 623 and a depth t1 of the cavity 611 and a depth t2 of the cavity 621 are made different from each other. What is different about the piezoelectric device 600, according to the third embodiment, from the piezoelectric device 100, according to the first embodiment, and the piezoelectric device 500, according to the second embodiment, is that the depths of the cavities 611 and 621 are varied by controlling the amount of etching of both of the thin film 602 and the substrate 601.

In the third embodiment, by using the phenomenon in which the resonant frequency of the piezoelectric resonator is varied with the cavity depth, a plurality of piezoelectric resonators having different resonant frequencies can be formed on the same substrate. Therefore, with the use of such piezoelectric resonators, a piezoelectric device (e.g., FIGS. 3A through 3C) and an antenna resonator (e.g., FIG. 4A) with an excellent characteristic can be easily achieved.

Figure 6B:
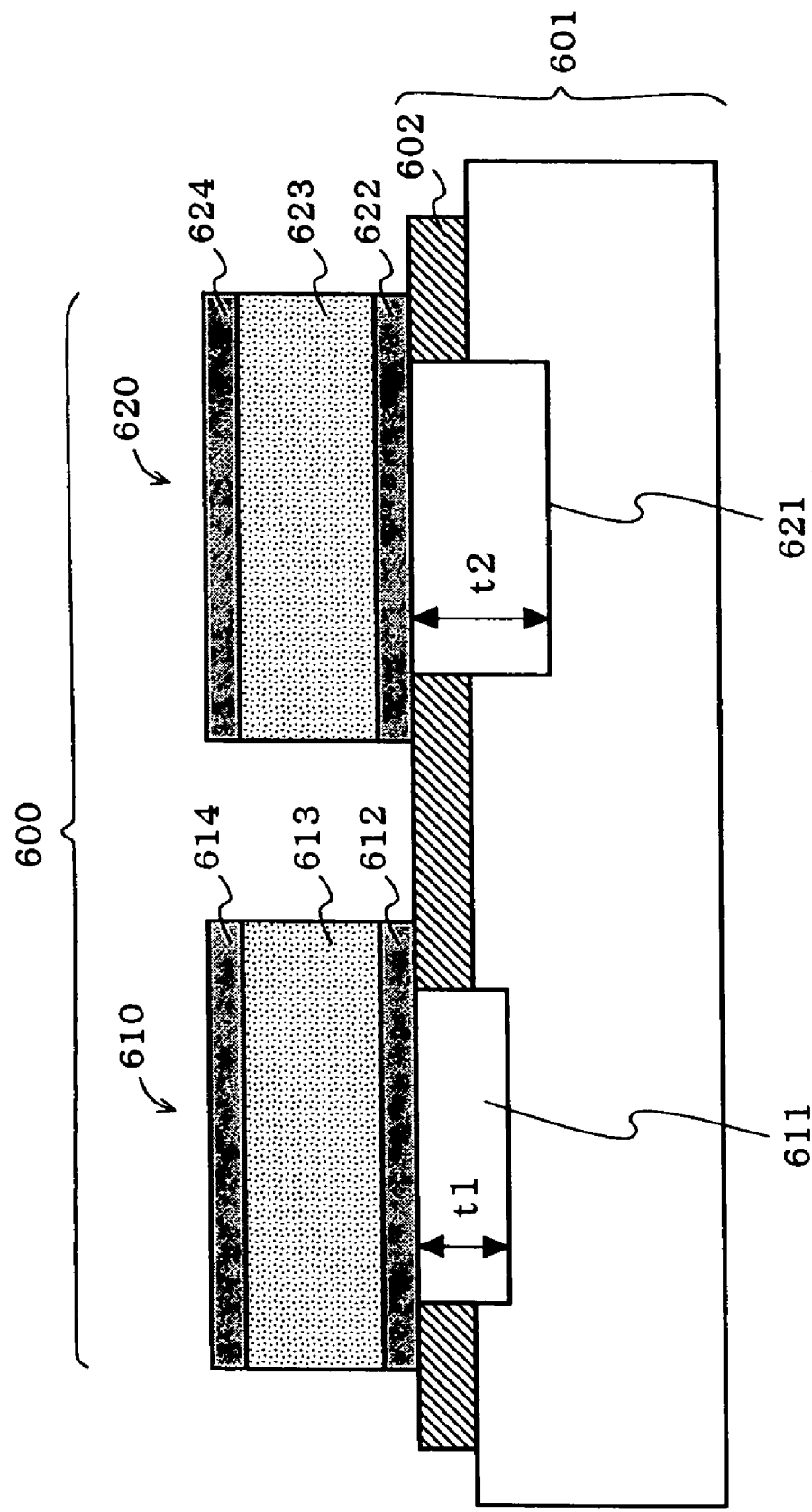

Note that, as shown in FIG. 6B, as long as the depth t1 of the cavity 611 and the depth t2 of the cavity 621 are different, both the thickness of the thin film 602 and the substrate 601 may be etched for both piezoelectric resonators 610 and 620. Also, the material of the thin film 602 may be arbitrary as long as it sufficiently support the piezoelectric resonators and allows formation of the cavities. Furthermore, the thin film 602 may be of one layer or multiple layers. The cavity depths are preferably set based on a sound velocity of the thin film 602, for example.

Fourth Embodiment

Figure 7:
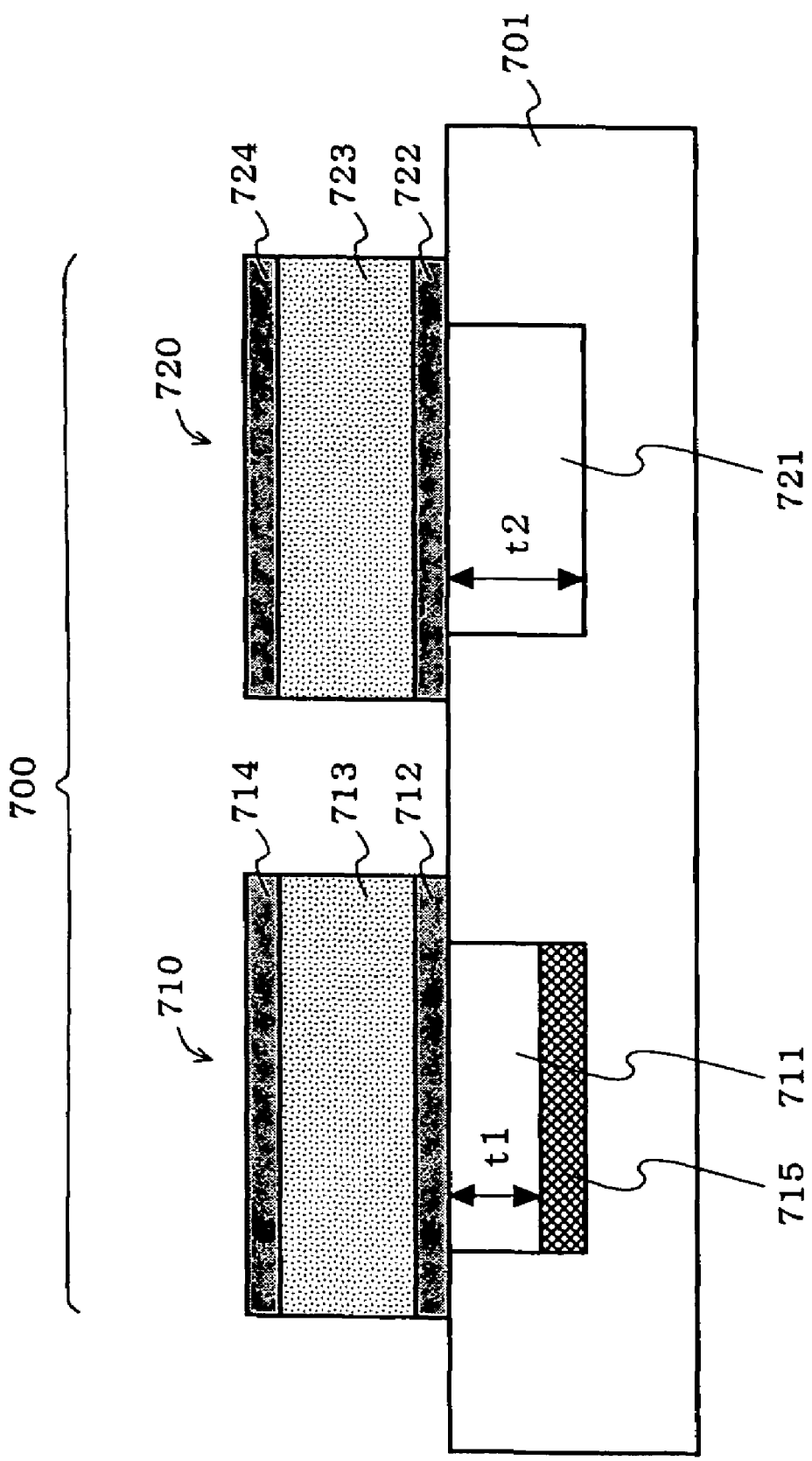
FIG. 7 is a section view of a piezoelectric device according to a fourth embodiment of the present invention.
Figure 8:
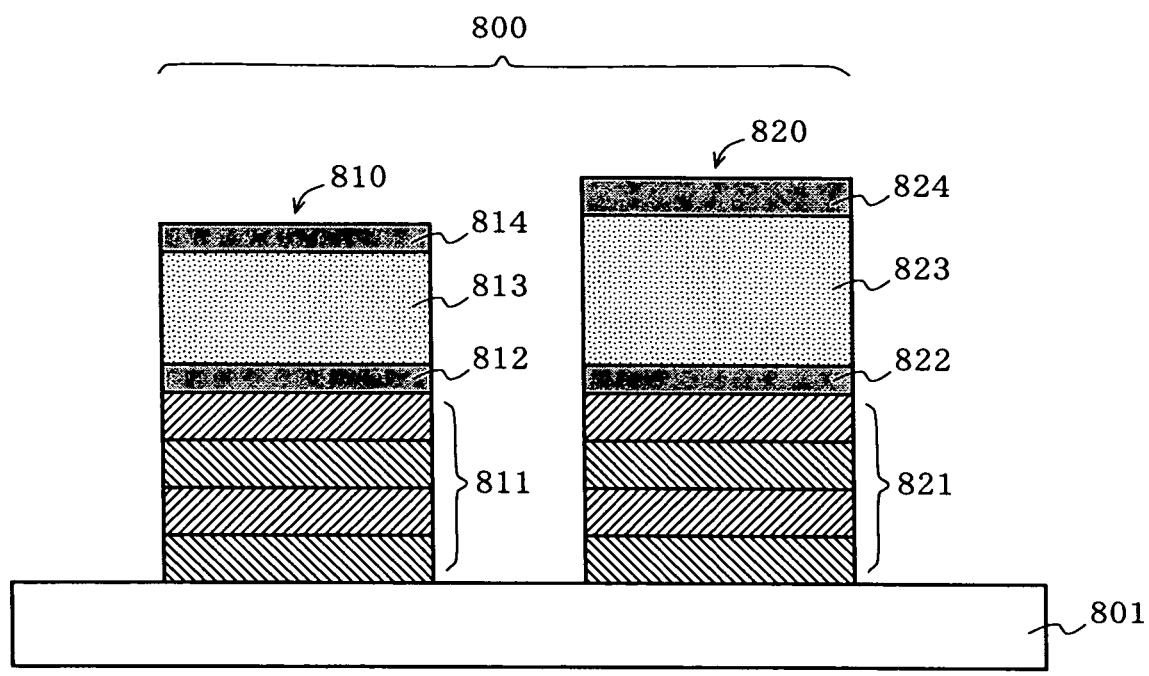
FIG. 8 is a section view of a conventional piezoelectric device.
Figure 9:
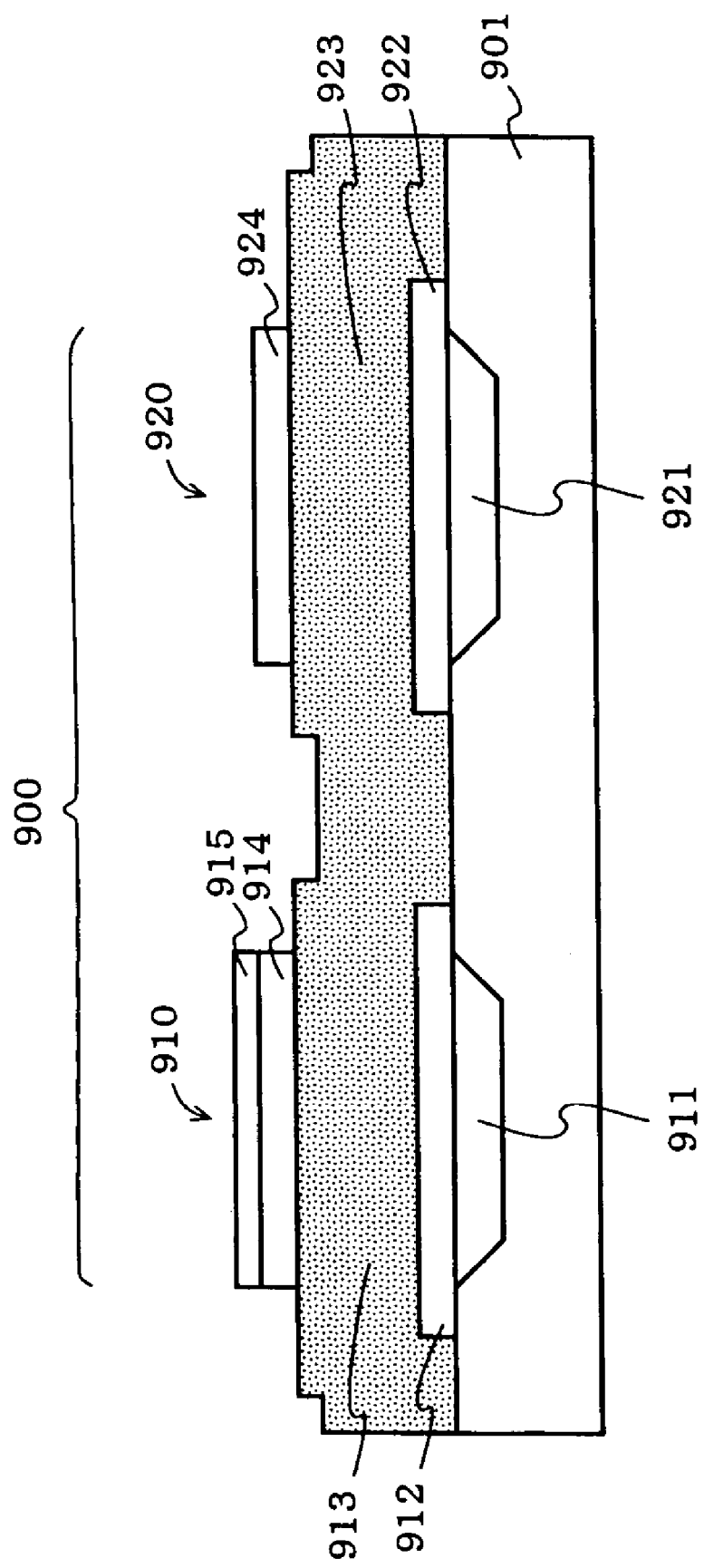
FIG. 9 is a section view of another conventional piezoelectric device.

FIG. 7 is a section view of a piezoelectric device 700 according to the fourth embodiment of the present invention. As shown in FIG. 7, the piezoelectric device 700 includes two piezoelectric resonators 710 and 720 so as to function as a piezoelectric filter. The piezoelectric resonator 710 has a structure in which an adjusting layer 715, a cavity 711, a lower electrode 712, a piezoelectric layer 713, and an upper electrode 714 are sequentially formed on a substrate 701. The piezoelectric resonator 720 has a structure in which a cavity 721, a lower electrode 722, a piezoelectric layer 723, and an upper electrode 724 are sequentially formed on the substrate 701. The cavities 711 and 721 are provided to ensure vibrations of the piezoelectric resonators 710 and 720. These cavities 711 and 721 are formed by etching the substrate 701.

As with the first through third embodiments, in the piezoelectric device 700 according to the fourth embodiment, in order to form a plurality of piezoelectric resonators having different resonant frequencies on the same substrate, a scheme is used in which the film thickness of the piezoelectric layer 713 is made equal to that of the piezoelectric layer 723 and a depth t1 of the cavity 711 and a depth t2 of the cavity 721 are made different from each other. What is different about the piezoelectric device 700 according to the fourth embodiment from the piezoelectric device 100 according to the first embodiment is that the depths of the cavities 711 and 721 are varied by etching the substrate 701 to form cavities with the same amount of etching and then providing an adjusting layer 715 on the bottom of one of the cavities formed by etching.

In the fourth embodiment, by using the phenomenon in which the resonant frequency of the piezoelectric resonator is varied with the cavity depth, a plurality of piezoelectric resonators having different resonant frequencies can be formed on the same substrate. Therefore, with the use of such piezoelectric resonators, a piezoelectric device (e.g., FIGS. 3A through 3C) and an antenna resonator (e.g., FIG. 4A) with an excellent characteristic can be easily achieved.

The cavity depths of the piezoelectric device described in the first through fourth embodiments can also be designed further in consideration of the following.

(1) Preventing spurious influences occurring due to vibration leak

Normally, vibrations of the vibrating portion formed by the lower electrode, the piezoelectric layer, and the upper electrode are leaked to the substrate. This vibration leak may cause a spurious phenomenon determined by the cavity depth to occur in the vicinity of the resonant frequency (or anti-resonant frequency) of the vibrating portion. This spurious phenomenon causes the band-pass characteristics of the piezoelectric filter to deteriorate, and therefore is desirably made as far away as possible from the resonant frequency (anti-resonant frequency) of the vibrating portion. To achieve this, the cavity depth is designed so that a resonant frequency of the unwanted vibration occurring at a cavity due to vibration leak is sufficiently away from the main resonant frequency of the vibrating portion of the piezoelectric resonator.

(2) Using unwanted vibration occurring due to vibration leak for main vibration.

As described above, unwanted vibration due to vibration leak may cause the band-pass characteristic of the piezoelectric device to deteriorate. However, such unwanted vibration occurring at the cavity can be used for the main vibration of the vibrating portion. That is, when the main vibration of the vibrating portion is weak, for example, the substrate is deliberately vibrated with the leaked vibration, thereby increasing the vibration amplitude of the entire piezoelectric resonator. In this case, the cavity depth is designed so that the resonant frequency of the unwanted vibration occurring at the cavity due to vibration leak coincides with the main resonant frequency of the vibrating portion of the piezoelectric resonator.

While the invention has been described in detail, the foregoing description is in all aspects illustrative and not restrictive. It is understood that numerous other modifications and variations can be devised without departing from the scope of the invention.

What is claimed is:

1. A piezoelectric device comprising a plurality of piezoelectric resonators, each piezoelectric resonator of said plurality of piezoelectric resonators comprising:
   a substrate;
   a cavity having a depth and on said substrate;
   a lower electrode on said substrate so as to cover said cavity on said substrate;
   a piezoelectric layer on said lower electrode; and
   an upper electrode on said piezoelectric layer, wherein
      said depth of said cavity of at least one piezoelectric resonator of said plurality of piezoelectric resonators is different from said depth of said cavity of another piezoelectric resonators of said plurality of piezoelectric resonators.

2. The piezoelectric device according to claim 1, wherein at least one of said cavities of said plurality of piezoelectric resonators is formed within said substrate.

3. The piezoelectric device according to claim 2, wherein said depth of said cavity of at least one piezoelectric resonator of said plurality of piezoelectric resonators is different from said depth of said cavity of all other piezoelectric resonators of said plurality of piezoelectric resonators.

4. The piezoelectric device according to claim 1, wherein at least one of said cavities of said plurality of piezoelectric resonators is formed within a thin film laminated on said substrate.

5. The piezoelectric device according to claim 4, wherein said depth of said cavity of at least one piezoelectric resonator of said plurality of piezoelectric resonators is different from said depth of said cavity of all other piezoelectric resonators of said plurality of piezoelectric resonators.

6. The piezoelectric device according to claim 1, wherein at least one of said cavities of said plurality of piezoelectric resonators is formed to extend through a thin film laminated on said substrate and into said substrate.

7. The piezoelectric device according to claim 6, wherein said depth of said cavity of at least one piezoelectric resonator of said plurality of piezoelectric resonators is different from said depth of said cavity of all other piezoelectric resonators of said plurality of piezoelectric resonators.

8. The piezoelectric device according to claim 1, wherein said plurality of piezoelectric resonators is arranged and connected to form a ladder type piezoelectric device.

9. The piezoelectric device according to claim 8, wherein said plurality of piezoelectric resonators arranged and connected to form said ladder type piezoelectric device includes at least a first piezoelectric resonator which operates as a serial resonator and a second piezoelectric resonator which operates as a parallel resonator; and said depth of said cavity of said first piezoelectric resonator is different from said depth of said cavity of said second piezoelectric resonator.

10. The piezoelectric device according to claim 8, wherein at least two piezoelectric resonators of said plurality of piezoelectric resonators operate as serial resonators, and said depth of said cavity of at least one of said plurality of piezoelectric resonators operating as serial resonators is different from said depth of said cavity of another piezoelectric resonator of said plurality of piezoelectric resonators.

11. The piezoelectric device according to claim 8, wherein at least two piezoelectric resonators of said plurality of piezoelectric resonators operate as parallel resonators, and said depth of said cavity of at least one of said plurality of piezoelectric resonators operating as parallel resonators is different from said depth of said cavity of another piezoelectric resonator of said plurality of piezoelectric resonators.

12. The piezoelectric device according to claim 8, wherein said depth of said cavity of at least one piezoelectric resonator of said plurality of piezoelectric resonators is different from said depth of said cavity of all other piezoelectric resonators of said plurality of piezoelectric resonators.

13. The piezoelectric device according to claim 1, wherein said plurality of piezoelectric resonators is arranged connected to form a lattice type piezoelectric device.

14. The piezoelectric device according to claim 13, wherein:
    said plurality of piezoelectric resonators arranged and connected to form said lattice type piezoelectric resonator device includes a first piezoelectric resonator which operates as a serial resonator and a second piezoelectric resonator which operates as a parallel resonator; and
    said depth of said cavity of said first piezoelectric resonator is different from said depth of said cavity of said second piezoelectric resonator.

15. The piezoelectric device according to claim 13, wherein at least two piezoelectric resonators of said plurality of piezoelectric resonators operate as serial resonators, and said depth of said cavity of at least one of said plurality of piezoelectric resonators operating as serial resonators is different from said depth of said cavity of another piezoelectric resonator of said plurality of piezoelectric resonators.

16. The piezoelectric device according to claim 13, wherein at least two piezoelectric resonators of said plurality of piezoelectric resonators operate as parallel resonators, and said depth of said cavity of at least one of said plurality of piezoelectric resonators operating as parallel resonators is different from said depth of said cavity of another piezoelectric resonators of said plurality of piezoelectric resonators.

17. The piezoelectric device according to claim 1, wherein:
    said plurality of piezoelectric resonators includes at least a first piezoelectric resonator and a second piezoelectric resonator which operate as serial resonators; and
    said depth of said cavity of said first piezoelectric resonator is different from said depth of said cavity of said second piezoelectric resonator.

18. The piezoelectric device according to claim 1, wherein:
    said plurality of piezoelectric resonators includes at least a first piezoelectric resonator and a second piezoelectric resonator which operate as parallel resonators; and
    said depth of said cavity of said first piezoelectric resonator is different from said depth of said cavity of said second piezoelectric resonator.

19. An antenna duplexer comprising:
    a transmission filter and a reception filter each including said piezoelectric device according to claim 1; and
    a phase-shift circuit connecting said transmission filter to said reception filter.

20. The piezoelectric device according to claim 1, wherein said depth of said cavity of at least one piezoelectric resonator of said plurality of piezoelectric resonators is different from said depth of said cavity of all other piezoelectric resonators of said plurality of piezoelectric resonators.

* * * * *